(12) United States Patent
Weng et al.

(10) Patent No.: US 8,829,559 B2
(45) Date of Patent: Sep. 9, 2014

(54) NITRIDE SEMICONDUCTOR LIGHT-EMITTING DEVICE AND PRODUCTION METHOD THEREOF

(75) Inventors: Yufeng Weng, Osaka (JP); Michael Brockley, Oxford (GB)

(73) Assignee: Sharp Kabushiki Kaisha, Osaka-shi (JP)

( * ) Notice: Subject to any disclaimer, the term of this patent is extended or adjusted under 35 U.S.C. 154(b) by 9 days.

(21) Appl. No.: 13/434,204

(22) Filed: Mar. 29, 2012

(65) Prior Publication Data
US 2012/0248490 A1     Oct. 4, 2012

(30) Foreign Application Priority Data

Mar. 31, 2011 (JP) .................................. 2011-078250
Jan. 23, 2012 (JP) .................................. 2012-010938

(51) Int. Cl.
| H01L 33/00 | (2010.01) |
| H01L 29/205 | (2006.01) |
| H01L 29/06 | (2006.01) |
| H01L 21/00 | (2006.01) |
| H01L 33/38 | (2010.01) |
| H01L 33/14 | (2010.01) |
| H01L 33/20 | (2010.01) |

(52) U.S. Cl.
CPC ............... *H01L 33/38* (2013.01); *H01L 33/382* (2013.01); *H01L 33/14* (2013.01); *H01L 33/20* (2013.01); *H01L 2933/0016* (2013.01)
USPC ............... 257/99; 257/103; 257/13; 257/91; 257/E33.005; 257/E33.025; 257/E33.62; 438/22; 438/46; 438/47

(58) Field of Classification Search
USPC ............ 257/103, 94, 13, 91, 76, 79, E31.126, 257/E33.005, E33.025, E33.062, 99; 438/22, 46, 47
See application file for complete search history.

(56) References Cited

U.S. PATENT DOCUMENTS

| 6,307,218 | B1 | 10/2001 | Steigerwald et al. |
| 6,417,525 | B1 * | 7/2002 | Hata ................................ 257/91 |
| 6,777,805 | B2 * | 8/2004 | Uemura et al. ................ 257/745 |
| 2002/0070383 | A1 * | 6/2002 | Shibata et al. ................... 257/76 |
| 2004/0095063 | A1 * | 5/2004 | Murazaki et al. .............. 313/503 |
| 2005/0156189 | A1 * | 7/2005 | Deguchi et al. ................ 257/103 |
| 2005/0156496 | A1 * | 7/2005 | Takashima et al. ............ 313/237 |
| 2008/0185606 | A1 | 8/2008 | Sano et al. |
| 2012/0001220 | A1 * | 1/2012 | Hiraiwa et al. ................. 257/98 |

FOREIGN PATENT DOCUMENTS

| JP | 8-250769 | 9/1996 |
| JP | 2000-164930 | 6/2000 |
| JP | 2003-524295 | 8/2003 |
| JP | 2008-192710 | 8/2008 |

(Continued)

*Primary Examiner* — Fernando L Toledo
*Assistant Examiner* — Aaron Gray
(74) *Attorney, Agent, or Firm* — Morrison & Foerster LLP

(57) ABSTRACT

In a nitride semiconductor light-emitting device having an n-side and a p-side electrode pad formed on the same side of a substrate wherein current distribution in the light-emitting device is improved by forming branch electrodes extended from the p-side electrode pad (and the n-side electrode pad), when sheet resistance values of n-side and p-side layers in the device are low enough, contact resistance between a p-type nitride semiconductor layer and a current diffusion layer of a transparent conductive film formed thereon is reduced and in-plane distribution of the sheet resistance is made uniform whereby improving the optical output, by increasing in a prescribed condition the sheet resistance value of the current diffusion layer.

16 Claims, 8 Drawing Sheets

(56) References Cited

FOREIGN PATENT DOCUMENTS

| JP | 2010-232649 | 10/2010 |
| WO | WO-01/41223 | 6/2001 |
| WO | WO 2010100949 A1 * | 9/2010 |

* cited by examiner (a)

(b)

NITRIDE SEMICONDUCTOR LIGHT-EMITTING DEVICE AND PRODUCTION METHOD THEREOF

This nonprovisional application is based on Japanese Patent Applications No 2011-078250 filed on Mar. 31, 2011 and No. 2012-010938 filed on Jan. 23, 2012 with the Japan Patent Office, the entire contents of which are hereby incorporated by reference.

BACKGROUND OF THE INVENTION

1. Field of the Invention

The present invention is related to a light-emitting device produced utilizing nitride semiconductor ($In_xAl_yGa_{1-x-y}N$, $0 \leq x < 1$, $0 \leq y < 1$) and particularly to a nitride semiconductor light-emitting device usable as a high-luminance light source for a backlight of a liquid crystal display device, usual illumination, etc. and also related to a production method thereof.

2. Description of the Background Art

Compound semiconductor light-emitting devices that can emit the three primary color lights of red, green and blue are indispensable in order to utilize the light-emitting devices for various illumination uses. Regarding light-emitting diodes (LEDs), it has not been possible until recent years to utilize LEDs for various illumination uses because the blue LED among LEDs of the three primary colors has not been well-completed and not been available.

However, after the blue LED formed with nitride semiconductor has been developed in the 1990s, illumination products including LEDs are utilized not only for traffic signals but also for backlights in liquid crystal monitors, backlights in liquid crystal televisions and further various illumination uses at home.

Recently, liquid crystal televisions equipped with LED backlights begin to become widely used in a rapid pace in association with their price decline. In addition, illumination devices using LEDs have merits of enabling lower power consumption, smaller space occupied by them, and free of mercury preferably to the environment, as compared with the conventional illumination devices. After the summer of 2009, illumination devices using LEDs have been put on the market at much less prices as compared with those before and thus become popular in a very rapid pace.

In the meantime, light emitted from an illumination device, a backlight of a liquid crystal television, or the like should necessarily be white light. In general, white light obtainable using an LED can be realized by a combination of a blue LED and a yellow YAG (yttrium-aluminum-garnet) phosphor or a combination of a blue LED, a green phosphor and a red phosphor. In other words, a blue LED is needed in the case of obtaining white light utilizing an LED. For this reason, it is desired to provide a method that can produce bright blue LEDs in large amounts at low prices.

In general, III-V compound semiconductors containing nitrogen as a V-group element, such as gallium nitride (GaN), aluminum nitride (AlN), indium nitride (InN) and mixed crystals thereof are used for light-emitting layers included in LEDs and laser diodes (LDs) that can emit lights of shorter wavelengths such as blue and bluish green lights.

A usual nitride semiconductor light-emitting device includes an n-type nitride semiconductor layer, a nitride semiconductor light-emitting layer and a p-type nitride semiconductor layer stacked in this order on a sapphire substrate. A p-side electrode pad and an n-side electrode pad for connection to an external electric source are formed on the p-type semiconductor layer side and the n-type semiconductor layer side, respectively.

The sheet resistance of the p-type nitride semiconductor layer is usually higher as compared to that of the n-type nitride semiconductor layer. For the purpose of assisting diffusion of electric current in the p-type semiconductor layer, therefore, a transparent conducive film such as of ITO (Indium Tin Oxide) is stacked on almost the entire area of the p-type semiconductor layer and then the p-side electrode pad is formed on the transparent conductive film. Accordingly, the transparent conductive film transmits light from the light-emitting layer and also acts as a current diffusion layer.

In the meantime, in the case of using an insulative substrate such as a sapphire substrate, it is not allowed to form the n-side electrode pad on the backside of the substrate. Therefore, the n-type semiconductor layer is partly exposed by etching from the p-type semiconductor layer side and thereafter the n-side electrode pad is formed on the exposed area. Then, by supplying electric current between the p-side electric pad and the n-side electrode pad, it is possible to obtain light emission from the light-emitting layer sandwiched between the p-type semiconductor layer and the n-type semiconductor layer.

Regarding the nitride semiconductor light-emitting device having the n-side electrode pad and the p-side electrode pad on the same side of the substrate as described above, each of Japanese National Patent Publication No. 2003-524295 and Japanese Patent Laying-Open No. 2000-164930 teaches to form branch portions extended from the n-side electrode pad and p-side electrode pad thereby to improve current distribution in the light-emitting device.

According to Japanese National Patent Publication No. 2003-524295, p-side branch electrodes are extended from the p-side electrode pad formed on the current diffusion layer made of the transparent conductive film on the p-type semiconductor layer. The light-emitting device has the n-type semiconductor layer including a partial area exposed by etching and then n-side branch electrodes are extended from the n-side electrode pad formed on the exposed area.

The n-side branch electrode and the p-side branch electrode are parallel to each other in their portions opposite to each other. In other ward, it is intended to set constant the distance in which current is diffused from the p-side branch electrode through the current diffusion layer made of the transparent conductive layer. Similarly, it is also intended to set constant the distance in which current is diffused from the n-side branch electrode. With these branch electrodes, therefore, it is possible to improve distribution uniformity of current flowing toward the n-side electrode pad from the p-side electrode pad.

In the meantime, regarding the nitride semiconductor light-emitting device including the transparent conductive film as described above, each of Japanese Patent Laying-Open No. 8-250769 and Japanese Patent Laying-Open No. 2008-192710 teaches to provide an insulative layer just under the electrode pad for the purpose of suppressing current concentration just under the electrode pad.

According to the nitride semiconductor light-emitting device disclosed in each of Japanese Patent Laying-Open No. 8-250769 and Japanese Patent Laying-Open No. 2008-192710, the insulative layer provided just under the electrode pad can effectively promotes current diffusion in the lateral directions in the transparent conductive film, thereby improving the light emission efficiency. However, there are problems as follows: light emission is intensified in the vicinity of the n-side electrode pad; good electric properties cannot be obtained; and the light emission efficiency cannot necessarily be improved.

Under the circumstances, Japanese Patent Laying-Open No. 2010-232649 for example discloses a nitride semiconductor light-emitting device, intending to obtain the effects as follows: current concentration in the transparent conductive film and the semiconductor layer just under the p-side electrode pad is suppressed thereby improving the light emission efficiency; light loss due to absorption and multiple-reflection caused by the electrode is suppressed thereby improving the light extraction efficiency; and the external quantum efficiency and electric properties are improved.

Regarding the conventional nitride semiconductor light-emitting device, it has been considered that from the viewpoint of the light emission efficiency, it is preferable to set the sheet resistance values of the n-side and p-side layers to be approximately the same thereby uniformly diffusing the current. On the other hand, Japanese Patent Laying-Open No. 2010-232649 describes that, as shown in FIGS. 9(a) and (b), the sheet resistance of n-type nitride semiconductor layer 101 on the n-side is set lower than that of transparent conductive film 102 on the p-side, thereby reducing light emission in the vicinity of n-side electrode pad 103 and then improving the light extraction efficiency. In this case, it is also described that the the light absorption and multiple-reflection due to p-side electrode pad 104 can be prevented by providing insulative layer 105 just under the electrode pad.

Japanese Patent Laying-Open No. 2010-232649 further describes that the operation voltage of nitride semiconductor light-emitting device 100 is influenced mainly by the sheet resistance of the n-side layers and then it is possible to significantly improve the electric properties by reducing the sheet resistance of the n-side layers, particularly in the case that high current of about 30-100 mA is applied to the light-emitting device.

In recent years, it is demanded that the nitride semiconductor light-emitting devices having further improved properties (higher output, lower voltage, lower heat emission) are provided at lower costs and then the devices having sheet resistance values of the n-side and p-side less than 10Ω/□ have been developed.

In such a nitride semiconductor light-emitting device, it is difficult to further reduce the sheet resistance value. If n-type impurities are added for the purpose of further reducing the sheet resistance value of the n-type nitride semiconductor layer, there is caused a problem that the crystalline quality of the n-type nitride semiconductor layer is deteriorated. Further, if the thickness of the n-type nitride semiconductor layer is increased, there is caused a problem that the productivity is lowered and the costs are increased.

SUMMARY OF THE INVENTION

In view of the problems as described above, the present invention is intended to improve the current diffusion efficiency, reduce the contact resistance, obtain higher uniformity of light emission and higher optical output, and reduce the operation voltage in the nitride semiconductor light-emitting device.

Regarding the nitride semiconductor light-emitting device having the electrode structure that includes the n-side electrode pad and the p-side electrode pad formed on the same side of the substrate and also includes the branch electrodes extending from the p-side electrode pad (and the n-side pad) whereby current distribution in the light-emitting device is improved, the present inventors have found as a result of various investigations that in the case that sheet resistance values of n-side and p-side layers are low enough, contact resistance between the p-type nitride semiconductor layer and the current diffusion layer of the transparent conductive film formed thereon can be reduced and in-plane distribution of the sheet resistance can be made uniform whereby improving the optical output, by increasing in a prescribed condition the sheet resistance of the current diffusion layer of the transparent conductive layer.

Namely, a nitride semiconductor light-emitting device according to an aspect of the present invention includes at least one n-type nitride semiconductor layer, an active layer and at least one p-type nitride semiconductor layer in this order in a nitride semiconductor region on an upper surface of a substrate, wherein the n-type nitride semiconductor layer has a partial exposed area formed by etching from the p-type nitride semiconductor layer side, an n-side electrode pad is formed on the partial exposed area of the n-type nitride semiconductor layer, a current diffusion layer is formed on the p-type nitride semiconductor layer, a p-side electrode pad and a p-side branch electrode extended therefrom are formed on the current diffusion layer, sheet resistance Rs2 of the current diffusion layer is higher than sheet resistance Rs1 of the n-type nitride semiconductor layer, and sheet resistance Rs2 of the current diffusion layer and sheet resistance Rs1 of the n-type nitride semiconductor layer satisfy the relation of $Rs2 = x \times Rs1$ where $1.5 \leq x \leq 4$.

Incidentally, it is preferable that sheet resistance Rs1 of the n-type nitride semiconductor layer is less than 10Ω/□. It is also preferable that an n-side electrode pad and an n-side branch electrode extended therefrom are formed on the partial exposed area of the n-type nitride semiconductor layer. It is further preferable that the partial exposed area of the n-type nitride semiconductor layer is formed approximately at the central part of a region encompassed by the p-side electrode pad and the p-side branch electrode extended therefrom in the nitride semiconductor region on the upper surface of the substrate. A current non-injection layer is preferably formed between the current diffusion layer and the p-type nitride semiconductor layer under the p-side electrode pad and the p-side branch electrode extended therefrom. The nitride semiconductor light-emitting device is preferably operated with a current of 100 mA or greater. The nitride semiconductor region is preferably in a rectangle shape, and a condition of $0.8 \leq Y/X < 1$ is preferably satisfied and a condition of $Y/X = 0.9$ is more preferably satisfied when the center of the p-side electrode pad and the center of the n-side electrode pad are connected with a straight line and then a side of the nitride semiconductor region parallel to the straight line has a length of X while another side perpendicular to the straight line has a length of Y. The p-side electrode pad and the n-side electrode pad are preferably allocated at the center in the longer side direction and aligned along the shorter side direction of the nitride semiconductor region.

A method of producing a nitride semiconductor light-emitting device according to another aspect of the present invention includes the steps of forming at least one n-type nitride semiconductor layer, an active layer and at least one p-type nitride semiconductor layer in this order in a nitride semiconductor region on an upper surface of a substrate; forming a partial exposed area of the n-type nitride semiconductor layer by etching a part of the p-type nitride semiconductor layer; forming an n-side electrode pad on the partial exposed area of the n-type nitride semiconductor layer; forming a current diffusion layer on the p-type nitride semiconductor layer; and forming a p-side electrode pad and a p-side branch electrode extended therefrom on the current diffusion layer, wherein sheet resistance Rs2 of the current diffusion layer is made higher than sheet resistance Rs1 of the n-type nitride semiconductor layer by annealing the current diffusion layer.

Incidentally, the current diffusion layer is preferably annealed so that sheet resistance Rs2 of the current diffusion layer and sheet resistance Rs1 of the n-type nitride semiconductor layer satisfy the relation of Rs2=x×Rs1 where 1.5≤x≤4. It is preferable that sheet resistance Rs1 of the n-type nitride semiconductor layer is less than 10Ω/☐. The current diffusion layer is annealed at a temperature preferably in a range of 380-430° C., more preferably in a range of 410-430° C. and most preferably of about 410° C.

According to the present invention, in the nitride semiconductor light-emitting device having the branch electrodes extended from the p-side electrode pad (and the n-side electrode pad), by increasing in a prescribed condition the sheet resistance of the current diffusion layer of the transparent conductive layer formed on the p-type nitride semiconductor layer, contact resistance between the p-type nitride semiconductor layer and the current diffusion layer of the transparent conductive film can be reduced and in-plane distribution of the sheet resistance can be made uniform whereby it becomes possible to obtain uniform in-plane light emission in the light emission portion of the nitride semiconductor light-emitting device and also improve the optical output. Furthermore, by forming the branch part extended from the n-side electrode pad, it is possible to further improve the uniformity of in-plain light emission in the light-emitting portion of the nitride semiconductor light-emitting device and further increase the optical output.

By setting sheet resistance Rs1 of the n-type nitride semiconductor layer to be less than 10Ω/☐, it is possible to reduce the operation voltage of the nitride semiconductor light-emitting device. In relation with reduced sheet resistance Rs1 of the n-type nitride semiconductor layer, it is possible to reduce sheet resistance Rs2 of the current diffusion layer too, and thus it becomes possible to reduce the operation voltage of the nitride semiconductor light-emitting device.

By forming the partial exposed area of the n-type nitride semiconductor layer approximately at the central part of the region encompassed by the p-side electrode pad and the p-side branch electrode extended therefrom, it is possible to reduce the non-light-emitting area and the light absorption area in the peripheral portions of the nitride semiconductor light-emitting device and then improve the efficiency of extracting light to the exterior.

By forming the current non-injection layer between the current diffusion layer and the p-type nitride semiconductor layer under the p-side electrode pad and the p-side branch electrode extended therefrom, the region under p-side electrode, which acts as a light absorption region, can be made non-light-emissive and the efficiency of extracting light to the exterior can be improved by a reflection effect of the current non-injection layer.

Since the nitride semiconductor light-emitting device of the present invention can stably work even with a large current of 100 mA or greater, it is possible to obtain high efficiency and high reliability of the device.

With the method of producing the nitride semiconductor light-emitting device according to the present invention, sheer resistance Rs2 of the current diffusion layer can be made higher than sheet resistance Rs1 of the n-type nitride semiconductor layer. Therefore, it is not necessary to further reduce the sheet resistance of the n-type nitride semiconductor layer. There is not caused the problem that the crystallinity of the n-type nitride semiconductor is deteriorated by further addition of n-type impurities or that increase of thickness of the n-type nitride semiconductor layer lowers the productivity and increases the costs. It is possible to improve the current diffusion efficiency in the nitride semiconductor light-emitting device. By optimizing the annealing temperature, it is also possible to reduce the contact resistance, obtain higher light emission uniformity and higher optical output, and reduce the operation voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<Nitride Semiconductor Light-Emitting Device>

Figure 1:
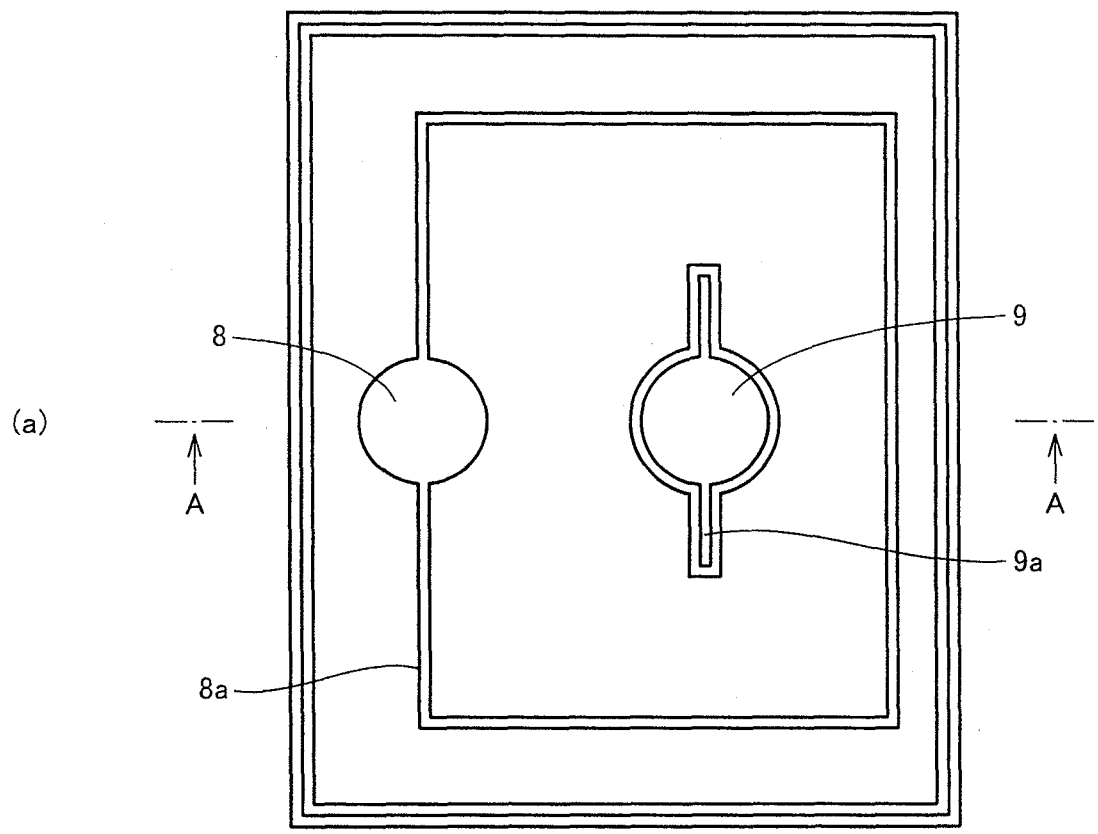
FIG. 1(a) is a plan view of an example of a nitride semiconductor light-emitting device producible according to an embodiment of the present invention.
FIG. 1(b) is a schematic cross-sectional view taken along a line A-A in FIG. 1(a).
Figure 1:
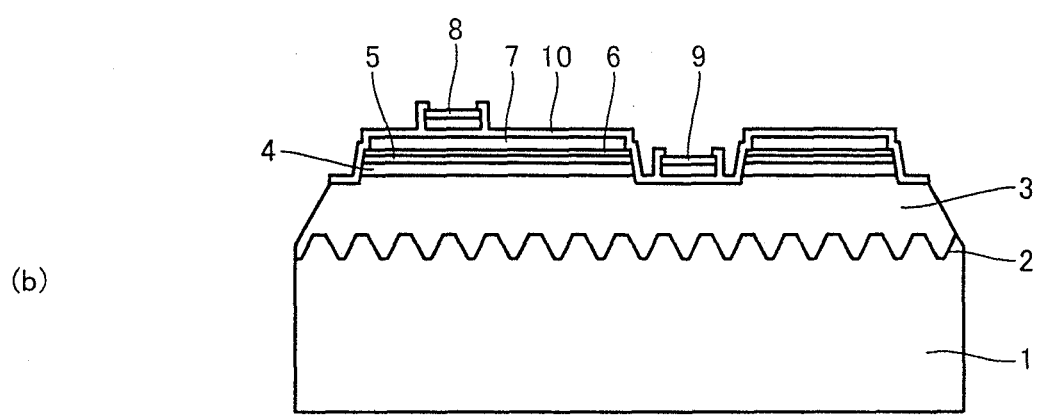

FIG. 1(a) shows a plan view of an example of a nitride semiconductor light-emitting device producible according to an embodiment of the present invention, and FIG. 1(b) is a schematic cross-sectional view taken along a line A-A in FIG. 1(a). Incidentally, in the drawings of this application, the length, width, thickness and so forth are arbitrarily changed for the purpose of clarification and simplification of the drawings and do not reflect the actual dimensional relations.

In the nitride semiconductor light-emitting device shown in FIG. 1(a) and (b), a buffer layer 2, an n-type nitride semiconductor layer 3, an active layer 4, a p-type clad layer 5 of a p-type nitride semiconductor layer, and p-type contact layer 6 are stacked in this order on a substrate 1 so as to form a nitride semiconductor stacked-layer body. Further, transparent current diffusion layer 7 is formed on p-type contact layer 6, and a p-side electrode pad 8 and a p-side branch electrode 8a extended therefrom are provided on a partial area of current diffusion layer 7. In the meantime, a part of n-type nitride semiconductor layer 3 is exposed by etching, and an n-side electrode pad 9 and n-side branch electrodes 9a extended therefrom are provided on the exposed area.

Here, a double heterojunction is formed by n-type nitride semiconductor layer 3, active layer 4 and p-type clad layer 5. For active layer 4, a single or a plurality of nitride semiconductor layers undoped or containing impurities of an n-type, a p-type or both thereof is selected so as to form a quantum well structure of a single layer or a plurality of layers as desired. Then, a p-n junction is formed between n-type nitride layer 3 and p-type clad layer 5 with active layer 4 sandwiched therebetween.

<N-type Nitride Semiconductor Layer>

In the light of the technical meaning of the double heterojunction, the clad layer has a greater bandgap as compared with the light-emitting layer and has a function of confining electrons and positive holes in the light-emitting layer by a potential barrier due to the gap difference. In this regard, n-type nitride semiconductor layer 3 in FIGS. 1(a) and (b) can include an n-type clad layer and also a contact layer for good ohmic contact with n-side electrode 9, as a matter of convenience. Such n-type nitride semiconductor layer 3 can be formed as a plurality of layer including, for example, not only a nitride semiconductor layer doped with n-type impurities but also an undoped nitride semiconductor layer etc. Namely, n-type nitride semiconductor layer 3 can include an undoped layer, an n-type doped layer, n-type contact layer, etc. as desired.

As described above, n-type nitride semiconductor layer 3 can be a single layer or a plurality of layers functioning as an n-type clad layer. In the case of the single layer, it is possible to use GaN, AlGaN, InAlGaN, or InGaN that can contain Si or can be undoped. In the case of n-type nitride semiconductor layer 3 including a plurality of layers, it can have a stacked-layer structure of InGaN/GaN, InGaN/AlGaN, AlGaN/GaN, InGaN/InGaN or the like, or have a periodic multilayer structure in which a plurality of layers are sacked repeatedly. Further, such a multilayer structure can have a supper lattice structure.

<Active Layer>

It is preferable that active layer 4 includes GaN barrier layers and well layers of nitride semiconductor containing. In that are alternately stacked. A preferable thickness of the well layer is in a range of 2-20 nm, depending on wavelength of light to be emitted. The structure of such active layer 4 can be not only a quantum well structure but also a single well structure, multiple-well structure, multiple-quantum-well structure or the like. In the case of active layer 4 including a plurality of well layers, at least one well layer should play a function of emitting light. Such a well layer is preferably formed with $In_pGa_{1-p}N$ (0<p<1), for example.

<P-Type Clad Layer>

As described above, in the light of the technical meaning of the double heterojunction, p-type clad layer 5 has a greater bandgap as compared with the light-emitting layer and has a function of confining electrons and positive holes in the light-emitting layer by a potential barrier due to the gap difference. In this regard, p-type nitride semiconductor layer 5 in FIGS. 1(a) and (b) can include an evaporation prevention layer, a carrier block layer and/or a p-type layer serving as a current diffusion layer. Namely, p-type nitride semiconductor layer 5 can be a single layer or a plurality of layers. In the case of the single layer, it is possible to use GaN, AlGaN, InAlGaN, or InGaN that are doped with p-type impurities or undoped. In the case of p-type clad layer 5 including a plurality of layers, it can have a stacked-layer structure of InGaN/GaN, InGaN/AlGaN, AlGaN/GaN, InGaN/InGaN or the like, or have a periodic multilayer structure in which a plurality of layers are sacked repeatedly. Further, such a multilayer structure can have a supper lattice structure.

A referable thickness of such p-type clad layer 5 is 500 nm or less. The reason why is that in the case of forming p-type clad layer 5 of a thickness greater than 500 nm by vapor deposition, active layer 4 is subjected to heat at a high temperature for a long time and thus light non-emission areas due to thermal deterioration of active layer 4 are increased. Incidentally, in order to prevent evaporation of In contained in active layer 4, an evaporation prevention layer is preferably provided in contact with active layer 4 and this layer can be included in upper p-type clad layer 5 as described above.

<P-Type Contact Layer>

P-type contact layer 6 is provided in order to reduce contact resistance with transparent current diffusion layer 7. Such p-type contact layer 6 is preferably made of nitride semiconductor doped with p-type impurities at a higher concentration as compared with p-type clad layer 5. Incidentally, current diffusion layer 7 may be formed on p-type clad layer 5 without providing p-type contact layer 6. In this case, it is preferable to increase concentration of p-type impurities in the vicinity of the upper surface of p-type clad layer 5.

<P-Side Electrode Pad and P-Side Branch Electrode Extended Therefrom>

P-side electrode pad 8 acts as a base for wire bonding for electrically connecting to an external circuit. In the meantime, p-side branch electrode 8a extended from p-side electrode pad 8 is formed on current diffusion layer 7 for the purpose of more uniformly injecting current into active layer 4. P-side electrode pad 8 and p-side branch electrode 8a extended therefrom can be formed in a known manner and it is possible to use materials such as Ti, Al and Au. Further, p-side electrode pad 8 and p-side branch electrode 8a extended therefrom can be formed with not only a single layer structure but also a multiple-layer structure. In the case of p-side electrode pad 8 having a multiple-layer structure, it is preferable to form an Au layer of about 500 nm thickness as the uppermost layer. With this preferable feature, when the compound semiconductor light-emitting device is mounted in a package, it is possible to keep stability of wire bonding with the external circuit.

Incidentally, a part of light emitted from active layer 4 is directed toward the p-type clad layer 5 side. Therefore, p-side electrode pad 8 and p-side branch electrode 8a extended therefrom are positioned in the direction in which light is extracted from active layer 4 toward p-type clad layer 5.

<N-Side Electrode Pad and N-Side Branch Electrode Extended Therefrom>

N-side electrode pad 9 acts as a base for wire bonding for electrically connecting to an external circuit. In the meantime, n-side branch electrodes 9a extended from n-side electrode pad 9 are formed for the purpose of more uniformly injecting current into active layer 4. N-side electrode pad 9 and n-side branch electrodes 9a extended therefrom can be formed in a known manner and it is possible to use materials such as Ti, Al and Au. Further, n-side electrode pad 9 and n-side branch electrodes 9a extended therefrom can be formed with not only a single layer structure but also a multiple-layer structure. In the case of n-side electrode pad 9 having a multiple-layer structure, it is preferable to form an Au layer of about 500 nm thickness as the uppermost layer. With this preferable feature, when the compound semiconductor light-emitting device is mounted in a package, it is possible to keep stability of wire bonding with the external circuit.

Incidentally, n-side electrode pad 9 and n-side branch electrodes 9a extended therefrom in FIGS. 1(a) and (b) are shown in an exemplary arrangement in the case of substrate 1 being made of an insulative material. Namely, in the case that an insulative material is used for substrate 1, n-side electrode pad 9 and n-side branch electrodes 9a extended therefrom are provided on a partial exposed area of n-type nitride semiconductor layer 3. However, in the case that a conductive material is used for substrate 1, n-side electrode pad 9 and n-side branch electrodes 9a extended therefrom can be formed on the backside of the substrate.

Incidentally, even in the case that there are not n-side branch electrodes 9a, contact resistance between the p-type nitride semiconductor layer and current diffusion layer 7 of the transparent conductive film is reduced and in-plane sheet resistance become more uniform as compared with the conventional examples, whereby in-plane light emission can be made more uniform and optical output is improved at the light-emitting portion of the nitride semiconductor device. Therefore, while n-side branch electrodes 9a can be omitted, it is possible by providing n-side branch electrodes 9a to make the in-plane light emission more uniform and increase the optical output at the light-emitting portion of the nitride semiconductor device.

<Current Diffusion Layer>

Current diffusion layer 7 is provided so as to transmit light emitted from active layer 4 and form contact with p-type contact layer 6 thereby diffusing current in the entire surface thereof and enlarging the light emission area of active layer 4 thereunder. Therefore, it is preferable that current diffusion layer 7 is formed using a material of lower resistance as compared with p-type contact layer 6. With this preferable feature, it is possible to diffuse current injected through p-side electrode pad 8 in the in-plane direction of current diffusion layer 7. As a material for such current diffusion layer 7, it is preferable to use ITO, IZO or the like for example and it is particularly preferable to use ITO. The reason for this is that ITO is excellent from the viewpoints of transparency and contact resistance.

Current diffusion layer 7 preferably has a thickness in a range of 100 nm to 400 nm. The reason why is that when current diffusion layer 7 is thinner than 100 nm, the sheet resistance thereof causes increase of the operation voltage of the light-emitting device and when current diffusion layer 7 is thicker than 400 nm, the transparency thereof is degraded thereby reducing the light extraction efficiency of the light-emitting device.

<Relation Between Sheet Resistance Rs2 of Current Diffusion Layer and Sheet Resistance Rs1 of N-Type Nitride Semiconductor Layer>

Regarding the nitride semiconductor light-emitting device including the portion extended in a branch manner from the p-side electrode pad (and the n-side electrode pad), it is confirmed that the optical output is increased with what relation between sheet resistance $Rs2$ of the current diffusion layer and sheet resistance $Rs1$ of the n-type nitride semiconductor layer, by forming some nitride semiconductor light-emitting devices having p-side branch electrodes in the electrode pattern shown in FIG. 1(a) and in some patterns optimized by simulation.

Figure 2:
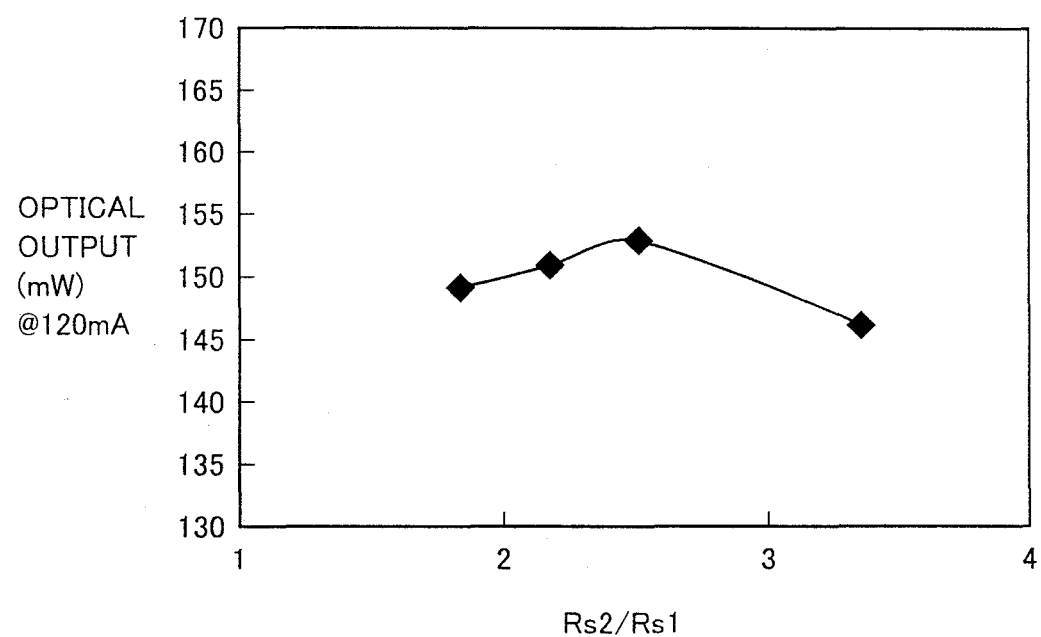
FIG. 2 is a graph showing the optical output depending on the relation (Rs2/Rs1) between sheet resistance Rs2 of the current diffusion layer and sheet resistance Rs1 of the n-type nitride semiconductor layer in the case of the p-side branch electrode pattern and the n-side branch electrode pattern shown in FIG. 1.

FIG. 2 shows the relation between the $Rs2/Rs1$ and the optical output in the case that a large current particularly of 100 mA or greater is applied in the electrode pattern of the nitride semiconductor light-emitting device shown in FIG. 1(a). As clear in FIG. 2, when sheet resistance $Rs2$ of the current diffusion layer is increased as compared to sheet resistance $Rs1$ of the n-type nitride semiconductor layer, the optical output of the nitride semiconductor light-emitting device gradually increases to the maximum in the vicinity of $Rs2/Rs1=2.5$ and thereafter decreases gradually. This tendency is similar even in nitride semiconductor light-emitting devices having different electrode patterns shown in the following.

FIGS. 3(a)-(c) are plan views of nitride semiconductor light-emitting devices that are formed with the similar structure as the nitride semiconductor light-emitting device shown in FIG. 1 but have p-side branch electrodes (and n-side branch electrodes) in modified shapes. As compared with FIG. 1(a) described above, the nitride semiconductor light-emitting device shown schematically in the plan view of FIG. 3(a) is characterized in that a p-side electrode pad 18, a p-side branch electrode 18a and an n-side electrode pad 19 are formed with providing no n-side branch electrode. As compared with FIG. 3(a), the nitride semiconductor light-emitting device shown schematically in the plan view of FIG. 3(b) is characterized in that p-side branch electrodes 28a are arranged with an approximately constant distance from an n-side electrode pad 29 as the center, and further p-side branch electrodes 28b and 28c are provided stemming from p-side branch electrodes 28a and arranged in the diagonal directions on the upper side of the nitride semiconductor light-emitting device on which side p-side electrode pad 28 is formed. Further, as compared with FIG. 3(b), the nitride semiconductor light-emitting device shown schematically in the plan view of FIG. 3(c) is characterized in that a p-side electrode pad 38, p-side branch electrodes 38a and an n-side electrode pad 39 are formed with providing no p-side branch electrode stemming from p-side branch electrodes 38a. FIG. 4 shows the relation between the $Rs2/Rs1$ and the optical output in the case that a large current particularly of 100 mA or greater is applied in these electrode patterns.

As clear in FIG. 4, even in the case of providing no n-side branch electrode, when sheet resistance $Rs2$ of the current diffusion layer is increased as compared to sheet resistance $Rs1$ of the n-type nitride semiconductor layer, the optical output of the nitride semiconductor light-emitting device shows a tendency to increase gradually. As compared with the case of providing the n-side branch electrodes, however, the position of the maximum of the optical output tends to shift in the direction in which sheet resistance $Rs2$ of the current diffusion layer is increased and it has been found that the higher optical output appears when a condition of $2 \leq Rs2/Rs1 \leq 4$ is satisfied.

Figure 3:
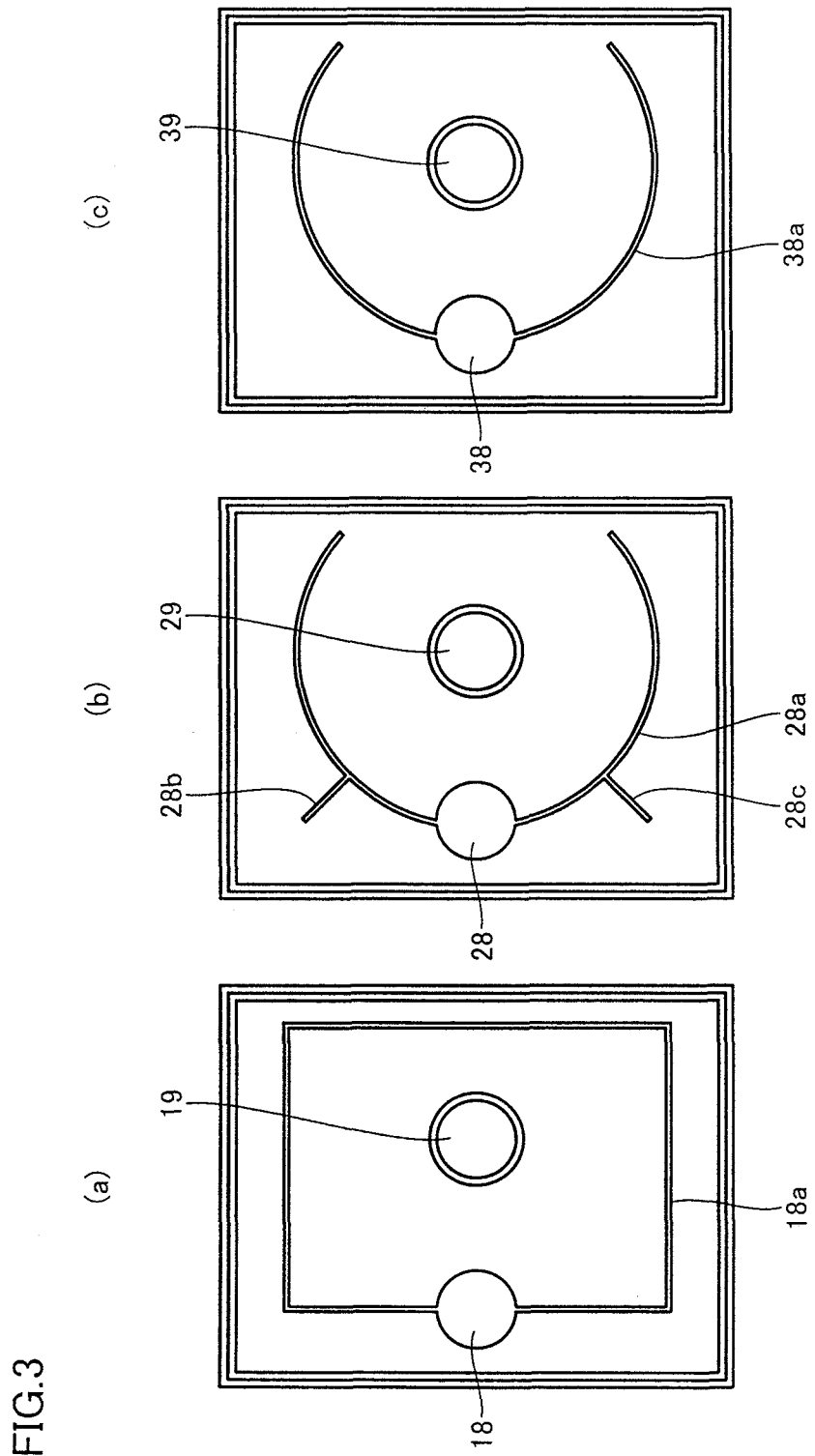
FIGS. 3(a)-(c) are plan views of examples of nitride semiconductor light-emitting devices with p-side branch electrodes in modified shapes according to other embodiments of the present invention.
Figure 4:
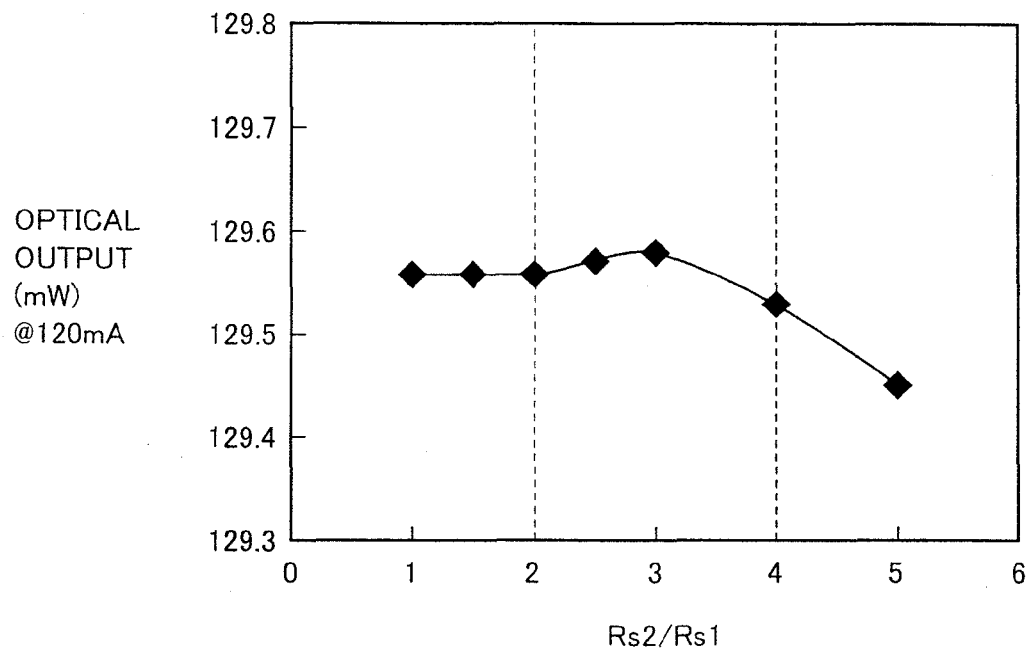
FIG. 4 is a graph showing the optical output depending on the relation (Rs2/Rs1) between sheet resistance Rs2 of the current diffusion layer and sheet resistance Rs1 of the n-type nitride semiconductor layer in the case of the respective electrode patterns shown in FIGS. 3(a)-(c).
Figure 5:
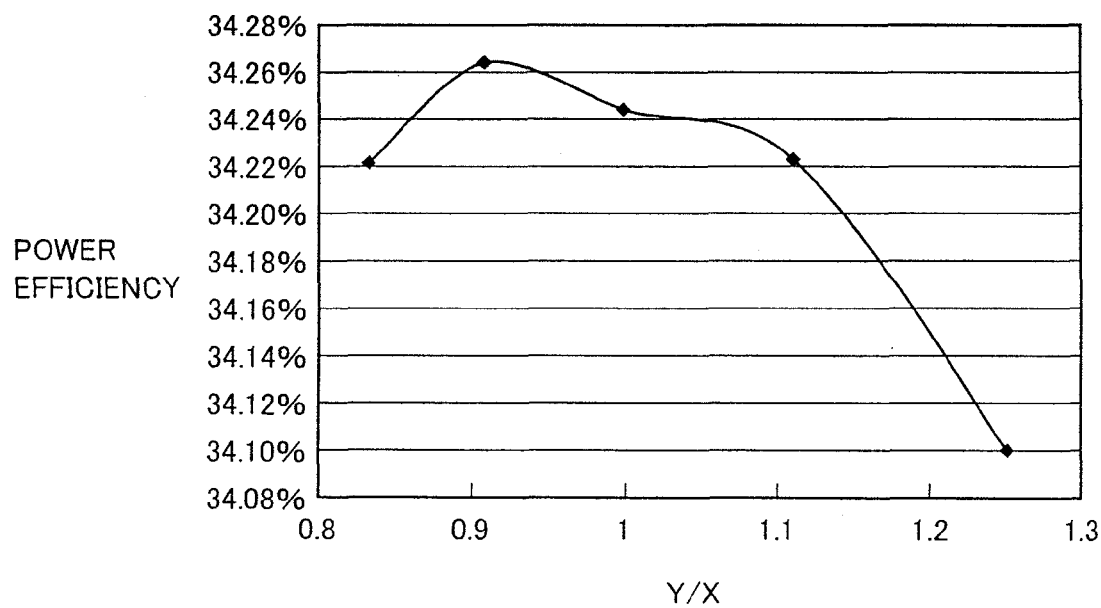
FIG. 5 is a graph showing the influence of value Y/X on the power efficiency (%) in the case that in the light-emitting device having its upper surface in a shape of approximately a square, a side of the device parallel to a straight line connecting the p-side electrode pad and the n-side electrode pad has a length of Y while another side of the device perpendicular to the straight line has a length of X.

FIG. 5 is a graph showing the influence of value Y/X on the power efficiency (%) in the light-emitting device having its upper surface in a shape of approximately a square as shown in FIG. 1 and FIG. 3 (a side of the device parallel to a straight line connecting the p-side electrode pad and the n-side electrode pad has a length of Y while another side of the device perpendicular to the straight line has a length of X). From this graph, it is understood that it is preferable to satisfy a condition of $0.8 \leq Y/X \leq 1$ and more preferable to satisfy $Y/X=0.9$.

Incidentally, the present invention is not restricted to the case of $0.8 \leq Y/X \leq 1$ but also applicable to the nitride semiconductor light-emitting device chip having its upper surface of a rectangle ($0.4 \leq Y/X \leq 0.8$). However, the nitride semiconductor light-emitting device chip having its upper surface in a shape of approximately a square can realize miniaturization of the nitride semiconductor light-emitting device, because that device having a smaller size (the upper surface area) can have its electric properties equivalent to those of the nitride semiconductor light-emitting device chip having its larger upper surface area in a rectangle shape.

Figure 6:
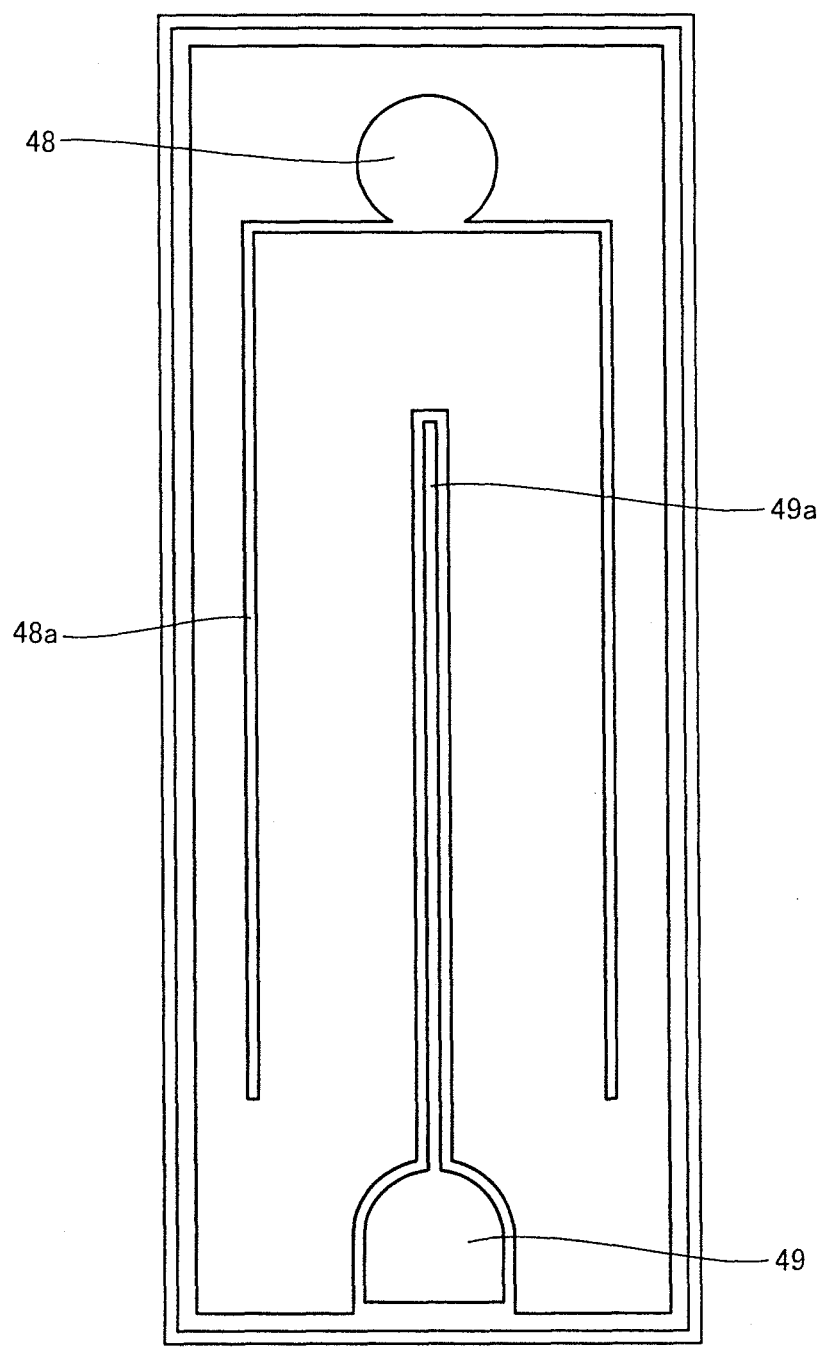
FIG. 6 is a plan view showing an example of a nitride semiconductor light-emitting device of a rectangle shape.

FIG. 6 is a plan view of a nitride semiconductor light-emitting device in a rectangle shape. The nitride semiconductor light-emitting device shown schematically in the plan view of FIG. 6 is different from the ones shown in FIG. 1 and FIG. 3 described above and then the ratio of shorter side Y to longer side X in the compound semiconductor light-emitting device is designed to 0.4. A p-side electrode pad 48, p-side branch electrodes 48a, an n-side electrode pad 49, and an n-side branch electrode 49a are formed in the rectangle nitride semiconductor light-emitting device of FIG. 6. In the case of this electrode pattern, the relation between the Rs2/Rs1 and the optical output at an injection current of 30 mA is shown in FIG. 7.

Figure 7:
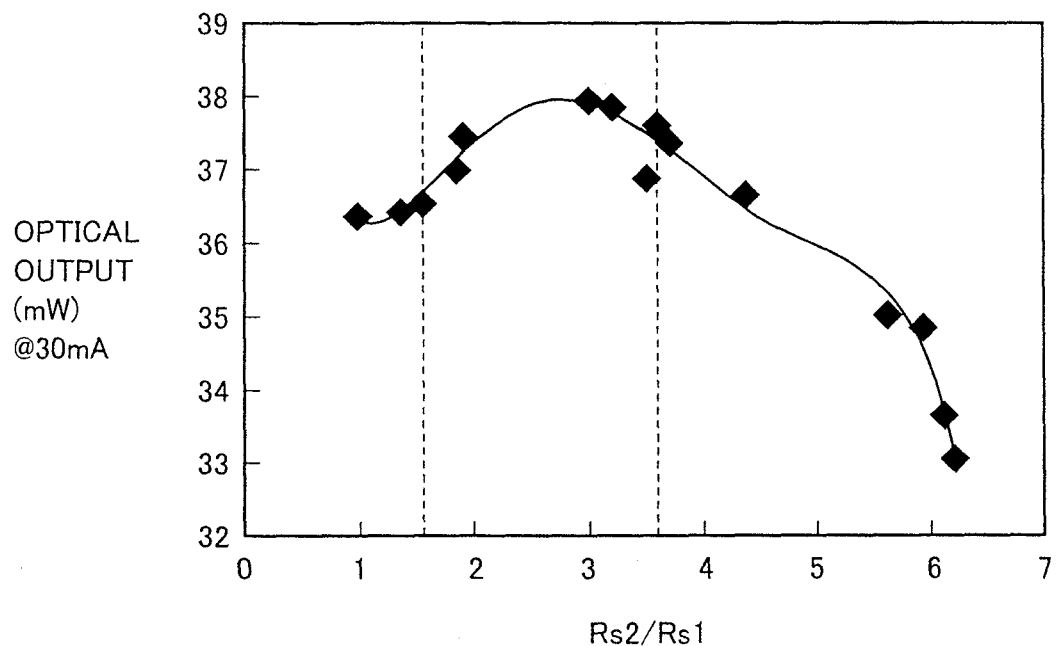
FIG. 7 is a graph showing the relation between the Rs2/Rs1 and the optical output in the case of the electrode pattern of the nitride semiconductor light-emitting device of the rectangle shape.

As clear in FIG. 7, in the case also of the nitride semiconductor light-emitting device of a rectangle shape, when sheet resistance Rs2 of the current diffusion layer is increased as compared to sheet resistance Rs1 of the n-type nitride semiconductor layer, the optical output of the nitride semiconductor light-emitting device shows a tendency to increase gradually. As compared with the case of the nitride semiconductor light-emitting device having its upper surface of approximately a square, however, the position of the maximum of the optical output tends to shift in the direction in which sheet resistance Rs2 of the current diffusion layer is decreased and it has been found that the nitride semiconductor light-emitting device of a rectangle shape shows its higher optical output when a condition of $1.5 \leq Rs2/Rs1 \leq 3.5$ is satisfied.

From the above consideration, it has bee found that the nitride semiconductor light-emitting device shows its higher optical output regardless its appearance configuration and electrode pattern when the relation between sheet resistance Rs2 of the current diffusion layer and sheet resistance Rs1 of the n-type nitride semiconductor layer satisfies at least a condition of $1.5 \leq Rs2/Rs1 \leq 4$.

In the following, light-emitting devices according to embodiments 1-4 of the present invention are formed based on the light-emitting device structure shown in FIG. 1(a) and (b) described above, and a light-emitting device of embodiment 5 is formed based on the light-emitting device structure shown in FIG. 3(c).

Table 1 shows the various properties of the nitride semiconductor light-emitting devices obtained according to embodiments 1-5.

TABLE 1

| Embodiment | Y/X | Second Annealing Temperature (° C.) | Sheet Resistance ($\Omega/\square$) ITO Transparent Electrode Layer (Rs2) | Sheet Resistance ($\Omega/\square$) N-type Semiconductor Layer (Rs1) | Sheet Resistance Ratio Rs2/Rs1 | Contact Resistance ($\Omega \cdot cm^2$) ITO-pGaN (Rc) | Optical Output Po (mW) Condition 120 mA | Voltage V (V) Condition 120 mA | Power Efficiency Condition 120 mA |
|---|---|---|---|---|---|---|---|---|---|
| 1 | 0.83 | 450 | 11 | 6 | 1.8 | 0.05 | 149 | 3.39 | 36.6% |
| 2 | 0.83 | 430 | 13 | 6 | 2.2 | 0.04 | 151 | 3.31 | 38.0% |
| 3 | 0.83 | 410 | 15 | 6 | 2.5 | 0.03 | 153 | 3.20 | 39.8% |
| 4 | 0.83 | 380 | 20 | 6 | 3.3 | 0.05 | 146 | 3.42 | 35.6% |
| 5 | 0.9 | 390 | 18 | 6 | 3 | 0.04 | 158 | 3.29 | 40.0% |

<Embodiment 1>

In a method of producing a nitride semiconductor light-emitting device according to Embodiment 1, an n-type nitride semiconductor layer 3 is deposited on a substrate 1 of sapphire having a main surface of a (0001) plane orientation for example with a buffer layer 2 of AlN intervening therebetween, as shown in FIG. 1(b). This n-type nitride semiconductor layer 3 includes a GaN underlayer of 9 μm thickness and an Si-doped n-type GaN contact layer (carrier concentration: about $6 \times 10^{18}$ cm$^{-3}$) deposited at a substrate temperature of about 1000° C. and has sheet resistance Rs1 of about 6-8 $\Omega/\square$.

An active layer 4 is deposited on n-type nitride semiconductor layer 3. This active layer 4 has a multiple-quantum-well structure in which n-type $In_{0.15}Ga_{0.85}N$ quantum well layers each having a thickness of 3.5 nm and Si-doped GaN barrier layers each having a thickness of 6 nm are deposited six times repeatedly at a substrate temperature of about 890° C., for example.

On active layer 4, at a substrate temperature of about 1080° C., a p-type clad layer 5 (carrier concentration: about $2 \times 10^{19}$ cm$^{-3}$) of Mg-doped p-type $Al_{0.2}Ga_{0.8}N$ of 15 nm thickness for example is deposited and then a p-type contact layer 6 (carrier concentration: about $5 \times 10^{19}$ cm$^{-3}$) of Mg-doped p-type AlGaN of 80 nm thickness for example is deposited thereby to form a nitride semiconductor region.

On p-type GaN contact layer 5, a current diffusion layer 7 of 180 nm thick ITO is formed by sputtering, for example. This ITO current diffusion layer 7 as deposited has sheet resistance Rs2 of about 200$\Omega/\square$. Deposited ITO current diffusion layer 7 is subjected to a first annealing at 600° C. for 10 minutes in a mixed gas atmosphere of 2% oxygen and 98% nitrogen so that transparency of ITO current diffusion layer 7 is increased to 94% or more with light of 450 nm wavelength. ITO current diffusion layer 7 is once exposed to the air after the first annealing and then set back into the furnace so as to be subjected to a second annealing at 450° C. for 5 minutes in a vacuum atmosphere thereby lowering sheet resistance Rs2 of ITO current diffusion layer 7. After this second annealing, sheet resistance Rs2 of ITO current diffusion layer 7 is reduced to 11$\Omega/\square$, and contact resistance Rc between ITO current diffusion layer 7 and p-type GaN contact layer 12 becomes 0.05 $\Omega \cdot cm^2$.

In the light-emitting device according to the present invention, it is particularly preferable that the thickness of ITO current diffusion layer 7 is in a range of 120 nm to 340 nm.

A partial area of ITO current diffusion layer 7 is removed by etching with a well-known photolithography method. In the area where ITO current diffusion layer 7 is partially removed, etching with the photolithography method is further conducted so that p-type contact layer 6, p-type clad layer 5 and active layer 4 are partially removed by the etching thereby to expose a partial area of n-type nitride semiconductor layer 3.

Thereafter, a p-side electrode pad 8, a p-side branch electrode 8a, an n-side electrode pad 9, and n-side branch electrodes 9a are simultaneously formed with (100 nm thick)Ni/(50 nm thick)Pt/(500 nm thick)Au for example, by electron evaporation and a well-known lift-off method with the photolithography. Here, from the viewpoints of accuracy of the photolithography and light absorption due to the electrodes, the widths of the p-side and n-side branch electrodes are set in a range of 4 μm to 8 μm. Incidentally, p-side branch electrode 8a is preferably formed about 15 μm inside from the longer sides of rectangle current diffusion layer 7 in order to avoid absorption of light emitted toward the side surfaces of the nitride semiconductor light-emitting device chip.

Further, oblique surfaces are formed on the side surfaces of n-type nitride semiconductor layer 3 by etching with the photolithography. In this Embodiment 1, the oblique angle at the side surface of nitride semiconductor layer 3 is set to 40 degrees with respect to a plane parallel to the layer. Due to the effect of this oblique surface, it is possible to increase light extraction efficiency at the periphery of the light-emitting device.

As described above, the nitride semiconductor light-emitting device of approximately a square having a longer side (X) of 532 μm and a shorter side (Y) of 443 μm is obtained in Embodiment 1.

<Embodiment 2>

In a method of producing a nitride semiconductor light-emitting device according to Embodiment 2 of the present invention, the second annealing after deposition of the ITO current diffusion layer is conducted in the vacuum atmosphere for 5 minutes at a temperature of 430° C. decreased as compared with Embodiment 1. As a result, sheet resistance Rs2 is increased to 13Ω/□, while contact resistance Rc between the ITO current diffusion layer and the p-type contact layer of p-type GaN is decreased to 0.04 Ω·cm². It is considered that sheet resistance Rs2 is increased as compared with Embodiment 1 because the crystallinity of the current diffusion layer is lowered. In the meantime, it is considered that contact resistance Rc between the current diffusion layer and the p-type contact layer of p-type GaN is decreased as compared with Embodiment 1 because the height of the Schottky barrier is lowered.

Further, the optical output at 120 mA in Embodiment 2 is increased as compared with Embodiment 1. As a reason for this, it is considered that the balance between sheet resistance Rs2 of the ITO current diffusion layer and sheet resistance Rs1 of the n-type nitride semiconductor layer becomes better so as to improve the current diffusion in the entire nitride semiconductor light-emitting device.

Furthermore, the operation voltage in Embodiment 2 is decreased as compared with Embodiment 1. As a reason for this voltage reduction, it is considered that while sheet resistance Rs2 is increased as compared with Embodiment 1, the current diffusion layer having p-side branch electrode 8a thereon is annealed at the second annealing temperature lower than that in Embodiment 1 so that contact resistance Rc between the current diffusion layer and the p-type contact layer is reduced and then this reduction has its voltage reduction effect greater than the voltage increase effect due to the increase of sheet resistance Rs2 of the current diffusion layer and thus the nitride semiconductor light-emitting device can totally have the decreased operation voltage.

<Embodiment 3>

In a method of producing a nitride semiconductor light-emitting device according to Embodiment 3 of the present invention, the second annealing after deposition of the ITO current diffusion layer is conducted in the vacuum atmosphere for minutes at an annealing temperature of 410° C. further decreased as compared with Embodiments 1 and 2. As a result, sheet resistance Rs2 is increased to 15Ω/□, while contact resistance Rc between the ITO current diffusion layer and the p-type contact layer of p-type GaN is decreased to 0.03 Ω·cm². Further, the optical output at 120 mA in this Embodiment 3 is increased to the highest and therefore it is understood that the second annealing temperature is most optimized.

<Embodiment 4>

In a method of producing a nitride semiconductor light-emitting device according to Embodiment 4 of the present invention, the second annealing after deposition of the ITO current diffusion layer is conducted in the vacuum atmosphere for 5 minutes at an annealing temperature of 380° C. further decreased as compared with Embodiments 1-3. As a result, sheet resistance Rs2 is increased to 20Ω/□, while contact resistance Rc between the ITO current diffusion layer and the p-type contact layer of p-type GaN is also increased to 0.05 Ω·cm² as compared with Embodiments 2 and 3. As a reason for the fact that contact resistance Rc between the ITO current diffusion layer and the p-type contact layer is increased differently from the case of Embodiments 2 and 3, it is considered that the interface junction between the current diffusion layer and the p-type contact layer is deteriorated when the second annealing temperature is lowered beyond a certain range. Further, due to increase in both sheet resistance Rs2 of the current diffusion layer and contact resistance R between the current diffusion layer and the p-type contact layer, the operation voltage of the nitride semiconductor light-emitting device is totally increased. Furthermore, as a reason for the fact that the optical output is decreased as compared with Embodiments 2 and 3, it is considered that the transparency of ITO is degraded because of the second annealing temperature lower than the optimum value.

Figure 8:
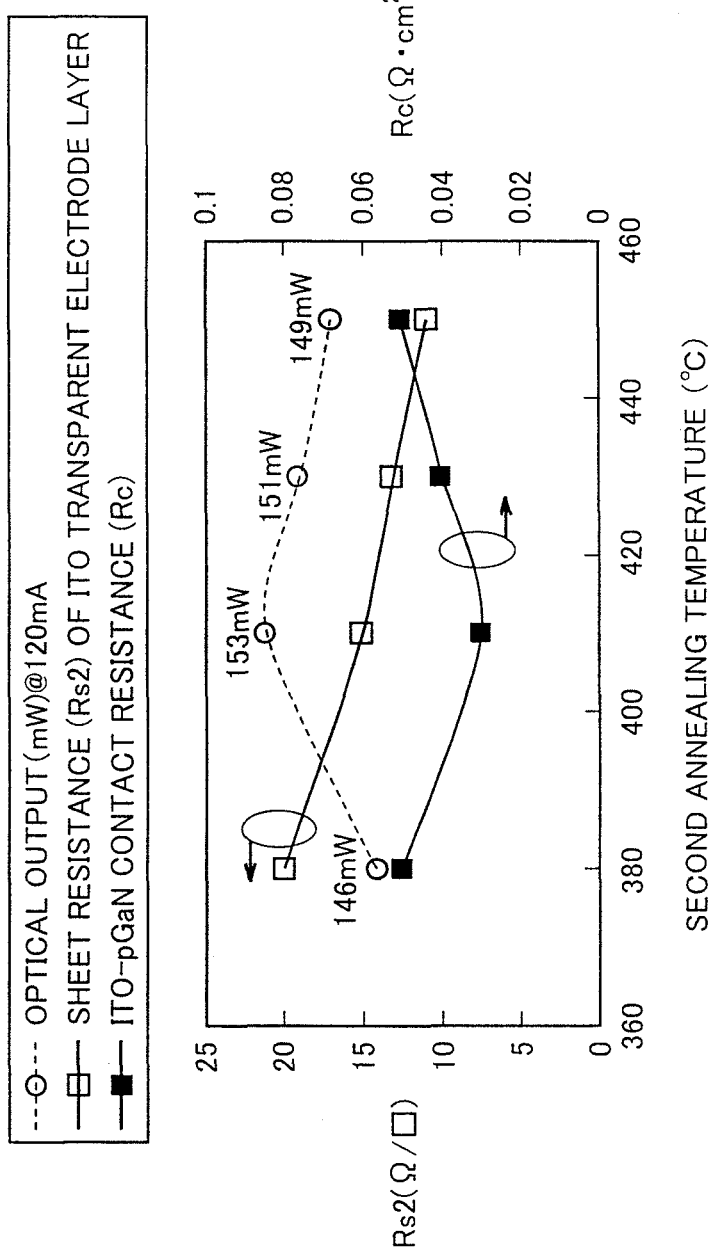
FIG. 8 is a graph showing the relation between the annealing temperature and sheet resistance Rs2 as well as the relation between the annealing temperature and contact resistance Rc between the current diffusion layer and the p-type contact layer.
Figure 9:
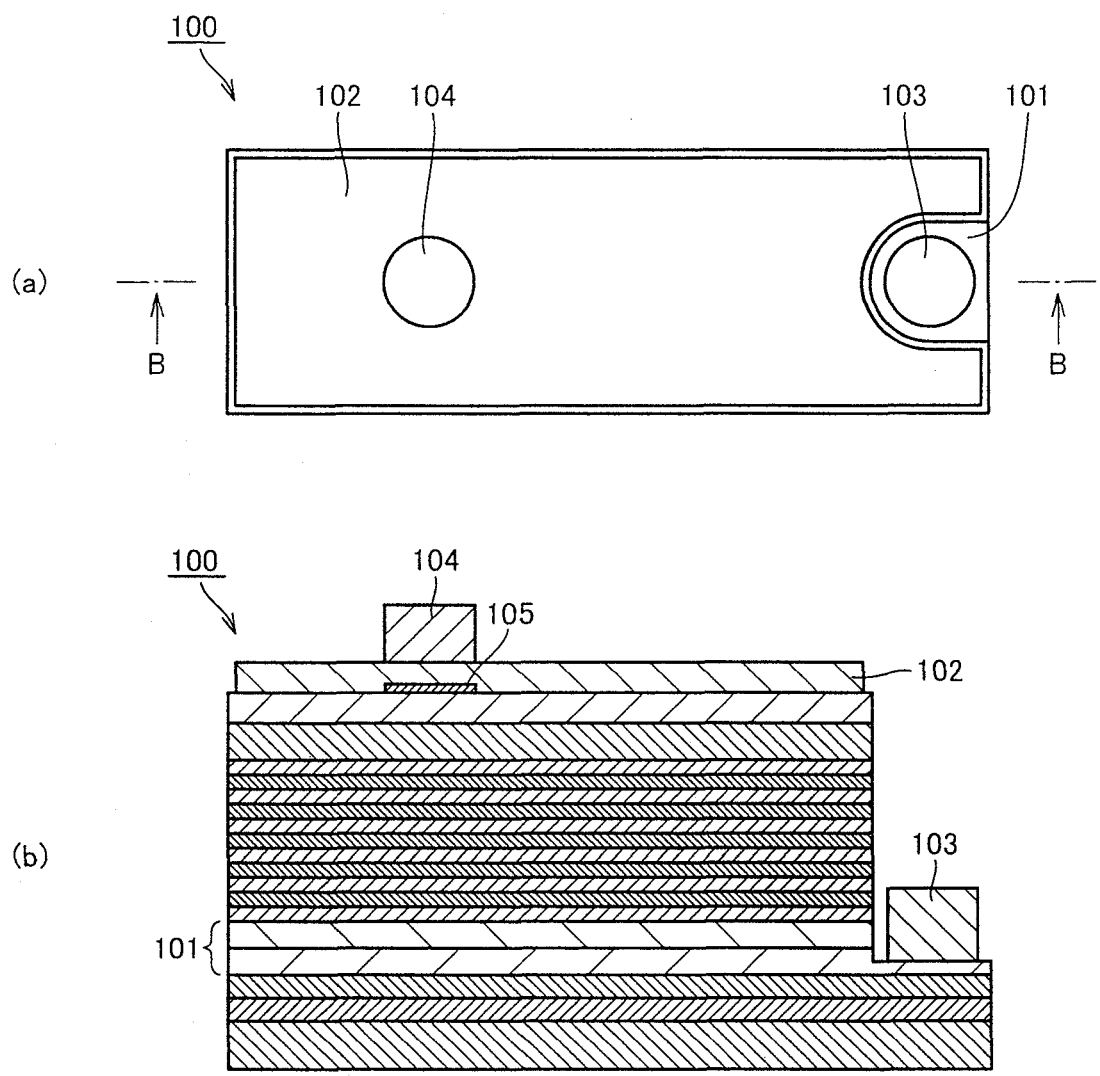
FIG. 9(a) is a plan view of a nitride semiconductor light-emitting device according to the conventional technology.
FIG. 9(b) is a schematic cross-sectional view taken along a line B-B in FIG. 9(a).

FIG. 8 shows the relation between the annealing temperature and sheet resistance Rs2 of the current diffusion layer as well as the relation between the annealing temperature and contact resistance Rc between the current diffusion layer and the p-type contact layer, in the range of the second annealing temperatures of Embodiments 1-4 described above.

As clear in FIG. 8, in the case that the second annealing temperature is in a range of 380° C. to 450° C., the optical output becomes higher than the conventional one. Further, since contact resistance Rc can be lowered, it is possible to lower the operation voltage of the nitride semiconductor light-emitting device. Contact resistance Rc with the p-type contact layer is optimized when the second annealing temperature is in the range of 410° C. and 430° C., and it becomes the lowest value with approximately 410° C.

By optimizing the second annealing temperature as in Embodiments 1-4 described above, when a large current of 100 mA or greater is injected into the nitride semiconductor light-emitting device, the current diffusion is improved, the light extraction efficiency becomes excellent, and lowering of the operation voltage is realized. Then it is possible to obtain the nitride semiconductor light-emitting device having excellent external quantum efficiency and electric properties.

Further, by providing current non-injection layer of insulator just under the p-side electrode pad, the p-side branch electrode, the n-side electrode pad, and the n-side branch electrodes in Embodiments 1-4, it is expected to more effectively improve the properties.

<Embodiment 5>

In Embodiment 5 of the present invention, a nitride semiconductor light-emitting device having the same chip area as in the case of Embodiment 1 and the electrode pattern of FIG. 3(c) is formed under conditions in which all the parameters are optimized to X=512 μm, Y=461 μm, Y/X=0.9, and Rs2/Rs2=3 (refer to FIG. 4). In the light-emitting device of this Embodiment 5, the best result of the power efficiency and the optical output can be obtained as shown in Table 1.

Although the embodiments of the present invention have bee describes in the above, it is expected to combine the various technical matters selected as desired from the embodiments. Further, although the present invention has been described and illustrated in detail, it is clearly understood that the same is by way of illustration and example only and is not to be taken by way of limitation, the scope of the present invention being interpreted by the terms of the appended claims.

According to the present invention, it is possible to improve the current diffusion efficiency, reduce the contact resistance, obtain the light emission uniformity and high optical output, and lower the operation voltage in the nitride semiconductor light-emitting device. The nitride semiconductor light-emitting device improved as such can be preferably used for the LED illumination, the backlight of the liquid crystal TV and so forth.

What is claimed is:

1. A nitride semiconductor light-emitting device comprising:
    at least one n-type nitride semiconductor layer, an active layer and at least one p-type nitride semiconductor layer stacked in this order on an upper surface of a substrate so as to form a nitride semiconductor region, said n-type nitride semiconductor layer having a partial exposed area formed by removing part of the p-type nitride semiconductor layer side,
    an n-side electrode pad formed on the partial exposed area of said n-type nitride semiconductor layer,
    a current diffusion layer formed on said p-type nitride semiconductor layer,
    a p-side electrode pad and a p-side branch electrode extended from the p-side electrode pad that are formed on said current diffusion layer,
    wherein sheet resistance Rs2 of said current diffusion layer and sheet resistance Rs1 of said n-type nitride semiconductor layer satisfy the relation of Rs2=x×Rs1 where 1≤x≤4,
    in plan view of nitride semiconductor light-emitting device, said nitride semiconductor region has a rectangle shape having a first side and a second side, and a condition of 0.8≤Y/X<1 is satisfied, when the center of said p-side electrode pad and the center of said n-side electrode pad are connected with a straight line, the first side is parallel to said straight line and has a length of Y, and the second side is perpendicular to said straight line and has a length of X, and
    said p-side electrode pad and said n-side electrode pad are allocated at the center in the longer side direction and aligned along the shorter side direction of said nitride semiconductor region.

2. The nitride semiconductor light-emitting device according to claim 1, wherein sheet resistance Rs1 of said n-type nitride semiconductor layer is less than 10 Ω/□.

3. The nitride semiconductor light-emitting device according to claim 1, wherein an n-side electrode pad and an n-side branch electrode extended therefrom are formed on the partial exposed area of said n-type nitride semiconductor layer.

4. The nitride semiconductor light-emitting device according to claim 1, wherein the partial exposed area of said n-type nitride semiconductor layer is formed approximately at the central part of a region encompassed by said p-side electrode pad and said p-side branch electrode extended therefrom in said nitride semiconductor region on the upper surface of said substrate.

5. The nitride semiconductor light-emitting device according to claim 1, wherein the nitride semiconductor light-emitting device is operated with a current of 100 mA or greater.

6. The nitride semiconductor light-emitting device according to claim 1, wherein a condition of Y/X=0.9 is satisfied.

7. The nitride semiconductor light-emitting device according to claim 1, wherein said n-side electrode pad is disposed closer to the center of said nitride semiconductor region than the p-side electrode is.

8. The nitride semiconductor light-emitting device according to claim 1, wherein said sheet resistance Rs2 of said current diffusion layer and said sheet resistance Rs1 of said n-type nitride semiconductor layer satisfy the relation of Rs2=x×Rs1 where 1.5≤x≤4.

9. The nitride semiconductor light-emitting device according to claim 1, wherein a condition of 0.83≤Y/X<1 is satisfied.

10. A method of producing a nitride semiconductor light-emitting device, comprising the steps of:
    forming at least one n-type nitride semiconductor layer, an active layer and at least one p-type nitride semiconductor layer in this order on an upper surface of a substrate to form a nitride semiconductor region,
    forming a partial exposed area of said n-type nitride semiconductor layer by etching a part of said p-type nitride semiconductor layer,
    forming an n-side electrode pad on the partial exposed area of said n-type nitride semiconductor layer,
    forming a current diffusion layer on said p-type nitride semiconductor layer,
    forming a p-side electrode pad and a p-side branch electrode extended therefrom on said current diffusion layer, and
    annealing the current diffusion layer so that sheet resistance Rs2 of said current diffusion layer and sheet resistance Rs1 of said n-type nitride semiconductor layer satisfy the relation of Rs2=x×Rs1 where 1≤x≤4,
    wherein in plan view of nitride semiconductor light-emitting device, said nitride semiconductor region has a rectangle shape having a first side and a second side, and a condition of 0.8≤Y/X≤1 is satisfied, when the center of said p-side electrode pad and the center of said n-side electrode pad are connected with a straight line, the first side is parallel to said straight line and has a length of Y, and the second side is perpendicular to said straight line and has a length of X, and
    said p-side electrode pad and said n-side electrode pad are allocated at the center in the longer side direction and aligned along the shorter side direction of said nitride semiconductor region.

11. The method of producing a nitride semiconductor light-emitting device according to claim 10, wherein sheet resistance Rs1 of said n-type nitride semiconductor layer is less than 10 Ω/□.

12. The method of producing a nitride semiconductor light-emitting device according to claim 10, wherein said current diffusion layer is annealed at a temperature in a range of 380-430° C.

13. The method of producing a nitride semiconductor light-emitting device according to claim 12, wherein said current diffusion layer is annealed at a temperature in a range of 410-430° C.

14. The method of producing a nitride semiconductor light-emitting device according to claim 13, wherein said current diffusion layer is annealed at a temperature of 410° C.

15. The method of producing a nitride semiconductor light-emitting device according to claim 10, wherein said sheet resistance Rs2 of said current diffusion layer and said sheet resistance Rs1 of said n-type nitride semiconductor layer satisfy the relation of Rs2=x×Rs1 where $1.5 \leq x \leq 4$.

16. The method of producing a nitride semiconductor light-emitting device according to claim 10, wherein a condition of $0.83 \leq Y/X < 1$ is satisfied.

* * * * *